(12) United States Patent
Chen et al.

(10) Patent No.: US 11,251,764 B2
(45) Date of Patent: Feb. 15, 2022

(54) AMPLIFICATION DEVICE

(71) Applicant: RichWave Technology Corp., Taipei (TW)

(72) Inventors: Chih-Sheng Chen, Taipei (TW); Jhao-Yi Lin, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 184 days.

(21) Appl. No.: 16/687,700

(22) Filed: Nov. 19, 2019

(65) Prior Publication Data
US 2021/0067120 A1   Mar. 4, 2021

(30) Foreign Application Priority Data

Sep. 2, 2019   (TW) ................................. 108131476

(51) Int. Cl.
*H03G 3/30*   (2006.01)
(52) U.S. Cl.
CPC .................................. *H03G 3/3042* (2013.01)
(58) Field of Classification Search
CPC ....................................................... H03G 3/304
See application file for complete search history.

(56) References Cited

U.S. PATENT DOCUMENTS

| | | | |
|---|---|---|---|
| 5,561,349 A * | 10/1996 | Hartai | H05B 41/2824 315/209 R |
| 6,236,274 B1 | 5/2001 | Liu | |
| 9,876,471 B2 * | 1/2018 | Modi | H03F 1/565 |
| 2005/0225202 A1 * | 10/2005 | Vogeley | H01L 41/042 310/317 |
| 2006/0091954 A1 | 5/2006 | Darabi | |
| 2017/0104537 A1 * | 4/2017 | Radice | H03F 3/45475 |
| 2020/0076384 A1 * | 3/2020 | Tanaka | H03F 1/565 |
| 2020/0228064 A1 * | 7/2020 | Datta | H04W 52/52 |

* cited by examiner

*Primary Examiner* — Patricia T Nguyen
(74) *Attorney, Agent, or Firm* — Winston Hsu

(57) ABSTRACT

An amplification device includes an amplification circuit, an inductor, a regulator, and a impedance circuit. The amplification circuit has an input terminal for receiving a radio frequency signal, and an output terminal for outputting an amplified radio frequency signal. The inductor has a first terminal, and a second terminal coupled to the output terminal of the amplification circuit. The regulator is coupled to the first terminal of the inductor and generates a steady voltage and/or a steady current. The impedance circuit has a first terminal coupled to the output terminal of the amplification circuit, and a second terminal coupled to a first system voltage terminal. The impedance circuit provides a low frequency impedance path to suppress a beat frequency signal in the amplified radio frequency signal.

20 Claims, 3 Drawing Sheets

AMPLIFICATION DEVICE

CROSS REFERENCE TO RELATED APPLICATION

This application claims priority of Taiwan application No. 108131476, which was filed on Sep. 2, 2019, and is included herein by reference.

TECHNICAL FIELD

The present invention is related to an amplification device, and more particularly to an amplification device capable of suppressing the third order intercept and intermodulation.

BACKGROUND

As networks and mobile devices are applied to more and more fields, the demand for wireless communications also increases. Radio frequency (RF) amplifiers are key components in wireless communications systems. The RF amplifier can amplify the RF signal of a specific frequency, so that the RF signal can be stably received to parse the information therein, serving the purpose of wireless communications. In order to adapt to different usage conditions, the RF amplifiers often need to amplify the RF signal to different intensities. However, during the process of signal amplification, it is often difficult for the RF amplifier to maintain linearity, resulting in distortion of the RF signal.

An important factor that affects the linear distortion of the RF amplifier is the third order intercept and intermodulation (IM3). Inter-modulation is a set of signals of different frequencies generated at the output of the RF amplifier after two or more input signals having similar frequencies suffers from the nonlinear characteristics of the amplifier. Also, among the signals caused by the Inter-modulation, since the frequency of the third-order intermodulation is closest to the frequency of the input signal, it is usually difficult to be filtered.

SUMMARY

One embodiment of the present invention discloses an amplification device. The amplification device includes an amplification circuit, a first inductor, a regulator, and an impedance circuit.

The amplification circuit has an input terminal configured to receive a radio frequency signal, and an output terminal configured to output an amplified radio frequency signal. The first inductor has a first terminal, and a second terminal coupled to the output terminal of the amplification circuit. The regulator is coupled to the first terminal of the first inductor and generates a steady voltage and/or a steady current. The impedance circuit has a first terminal coupled to the output terminal of the amplification circuit, and a second terminal coupled to a first system voltage terminal. The impedance circuit provides a low frequency impedance path to suppress a beat frequency signal in the amplified radio frequency signal.

Another embodiment of the present invention discloses an amplification device. The amplification device includes an amplification circuit, a first inductor, a regulator, and a low frequency impedance unit.

The amplification circuit has an input terminal configured to receive a radio frequency signal, and an output terminal configured to output an amplified radio frequency signal. The first inductor has a first terminal, and a second terminal coupled to the output terminal of the amplification circuit. The regulator is coupled to the first terminal of the first inductor and generates a steady voltage and/or a steady current. The low frequency impedance unit has a first terminal coupled to the first terminal of the first inductor, and a second terminal coupled to a first system voltage terminal. The low frequency impedance unit provides a low frequency impedance path to suppress a beat frequency signal in the amplified radio frequency signal.

DETAILED DESCRIPTION

Figure 1:
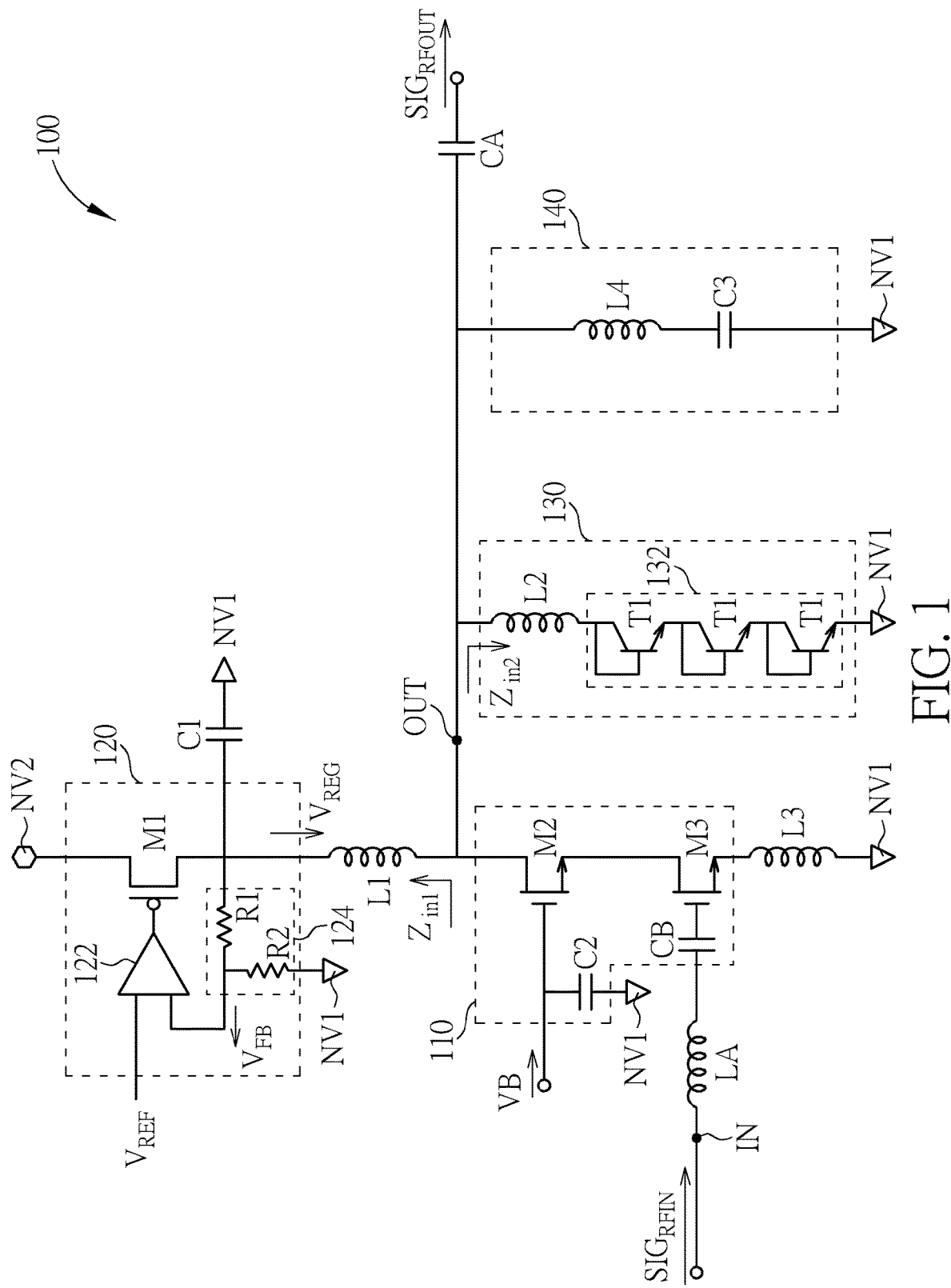
FIG. 1 shows an amplification device according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows an amplification device 100 according to one embodiment of the present invention. The amplification device 100 includes an amplification circuit 110, a first inductor L1, a regulator 120, and an impedance circuit 130. The amplification circuit 110 has an input terminal IN and an output terminal OUT. The input terminal IN of the amplification circuit 110 can receive the RF signal $SIG_{RFIN}$, and the amplification circuit 110 can amplify the RF signal $SIG_{RFIN}$ and output the amplified RF signal $SIG_{RFOUT}$ through the output terminal OUT.

The first inductor L1 has a first terminal, and a second terminal coupled to the output terminal OUT of the amplification circuit 110. The regulator 120 can be coupled to the first terminal of the first inductor L1, and can generate a steady voltage $V_{REG}$. Consequently, the output terminal OUT of the amplification circuit 110 can receive the steady voltage $V_{REG}$ through the first inductor L1 for performing the amplifying function. In addition, the present invention is not limited to using the regulator 120 to generate the steady voltage $V_{REG}$. In some embodiments, the regulator 120 can also be used to generate the steady current required by the amplification circuit 110.

In some embodiments, the RF signal $SIG_{RFIN}$ can include a plurality of signals with frequencies close to a center frequency, and IM3 may be generated after the signals with frequencies close to the center frequency suffer from the nonlinear characteristics of the amplification circuit 110. In some embodiments, IM3 is mainly caused by the double frequency signal and the beat frequency signal of the RF signal $SIG_{RFIN}$, and the beat frequency signal is a low frequency signal close to a direct current (DC) signal; therefore, the amplification device 100 can provide a low impedance path at the output terminal OUT of the amplification circuit 110 for the low frequency signals, thereby suppressing the beat frequency signal and reducing IM3.

For example, since the first inductor L1 can be deemed as a low impedance component for low frequency signals, if the regulator 120 can also provide a low impedance path for low frequency signals, the beat frequency signal close to a DC signal can be guided to the second system voltage terminal NV2 through the first inductor L1 and the regulator 120. However, in some embodiments, to suppress the beat frequency signal even more efficiently, the amplification device 100 can use the impedance circuit 130 to provide a low impedance path in parallel with the current path formed by the first inductor L1 and the regulator 120, directing the beat frequency signal to the first system voltage terminal NV1. For example, the impedance circuit 130 can have a first terminal coupled to the output terminal OUT of the amplification circuit 110, and a second terminal coupled to the first system voltage terminal NV1. In some embodiments, to suppress the beat frequency signal in the amplified RF signal $SIG_{RFOUT}$ with the impedance circuit 130 effectively, for the amplified radio frequency signal $SIG_{RFOUT}$, the low frequency input impedance $Z_{in2}$ of the impedance circuit 130 can be smaller than the low frequency input impedance $Z_{in1}$ of the first inductor L1. Consequently, the amplification device 100 can suppress the beat frequency signal effectively with the impedance circuit 130, thereby reducing IM3.

In FIG. 1, the impedance circuit 130 can include a second inductor L2 and a low frequency impedance unit 132 coupled in series between the first terminal and the second terminal of the impedance circuit 130. The second inductor L2 has a first terminal coupled to the first terminal of the impedance circuit 130, and a second terminal. Also, the second inductor L2 can be, for example but not limited to, a choke inductor. The low frequency impedance unit 132 has a first terminal coupled to the second terminal of the second inductor L2, and a second terminal coupled to the second terminal of the impedance circuit 130.

Furthermore, in some embodiments, to keep the amplification circuit 110 biased properly, the impedance of the low frequency impedance unit 132 can be changed with the voltage across the low frequency impedance unit 132. For example, when the voltage across the low frequency impedance unit 132 is lower, the impedance of the low frequency impedance unit 132 would be greater. Also, when the voltage becomes greater than a specific value, the impedance of the low frequency impedance unit 132 would be smaller. In FIG. 1, the low frequency impedance unit 132 can include at least one diode-connected transistor T1, and the number of the diode-connected transistors T1 can be determined according to the steady voltage $V_{REG}$ outputted by the regulator 120. In the embodiment of FIG. 1, to keep the voltage of the output terminal OUT of the amplification circuit 110 greater than 2V when the low frequency impedance unit 132 provides the low impedance path, the low frequency impedance unit 132 can, for example but not limited to, include three diode-connected transistors T1. The diode-connected transistors T1 each can be implemented by an NPN bipolar junction transistor having its base coupled to its collector. In this case, the base and the collector of the NPN bipolar junction transistor can be coupled together and can be deemed as the anode of a diode, while the emitter of the NPN bipolar junction transistor can be deemed as the cathode of the diode. However, in some other embodiments, the diode-connected transistor can also be implemented with a PNP bipolar junction transistor, a metal-oxide-semiconductor field effect transistor, or other types of transistors.

In FIG. 1, the regulator 120 can include a first transistor M1, an amplifier 122, and a feedback unit 124. The first transistor M1 has a first terminal coupled to the second system voltage terminal NV2, a second terminal coupled to the first terminal of the first inductor L1, and a control terminal. The amplifier 122 has a first input terminal for receiving the reference voltage $V_{REF}$, a second input terminal for receiving the feedback voltage $V_{FB}$, and an output terminal coupled to the control terminal of the first transistor M1. The feedback unit 124 has a first terminal coupled to the second terminal of the first transistor M1, and a second terminal for outputting the feedback voltage $V_{FB}$ to the second input terminal of the amplifier 122. The feedback unit 124 can generate the feedback voltage $V_{FB}$ according to the steady voltage $V_{REG}$ outputted by the regulator 120, so the amplifier 122 can control the first transistor M1 to output the steady voltage $V_{REG}$ stably. In FIG. 1, the feedback unit 124 can include resistors R1 and R2. The resistor R1 has a first terminal coupled to the first terminal of the feedback unit 124, and a second terminal coupled to the second terminal of the feedback unit 124. The resistor R2 has a first terminal coupled to the second terminal of the feedback unit 124, and a second terminal coupled to the first system voltage terminal NV1.

Furthermore, the amplification device 100 can include a capacitor C1, and the regulator 120 can be coupled to the capacitor C1. The capacitor C1 has a first terminal coupled to the second terminal of the first transistor M1, and a second terminal coupled to the first system voltage terminal NV1.

The amplification circuit 110 can include a second transistor M2, capacitors C2 and CB, and a third transistor M3. The second transistor M2 has a first terminal coupled to the output terminal OUT of the amplifier 110, a second terminal, and a control terminal for receiving the bias voltage VB. The capacitor C2 has a first terminal coupled to the first system voltage terminal NV1, and a second terminal coupled to the control terminal of the second transistor M2. The capacitor CB has a first terminal coupled to the input terminal IN of the amplification circuit 110, and a second terminal. The third transistor M3 has a first terminal coupled to the second terminal of the second transistor M2, a second terminal, and a control terminal coupled to the second terminal of the capacitor CB. Furthermore, the amplification device 100 can further include an inductor L3. The inductor L3 has a first terminal coupled to the second terminal of the third transistor M3, and a second terminal coupled to the first system voltage terminal NV1.

In some embodiments, IM3 is mainly caused by the double frequency signal and the beat frequency signal of the RF signal $SIG_{RFIN}$, therefore, to reduce IM3, the amplification device 100 can further include a filter 140. The filter 140 has a first terminal coupled to the output terminal OUT of the amplification circuit 100, and a second terminal coupled to the first system voltage terminal NV1. The filter 140 can filter signals having a frequency two times the frequency of the RF signal $SIG_{RFIN}$. Consequently, IM3 can be further reduced. In FIG. 1, the filter 140 can, for example but not limited to, include a capacitor C3 and an inductor L4. However, in some other embodiments, according to the system requirement, the filter 140 can further include other components, such as resistors, and/or more capacitors and inductors.

In addition, in FIG. 1, the amplification device 100 can further include a capacitor CA. The capacitor CA can be coupled to the output terminal OUT of the amplification circuit 110. The capacitor CA can not only be used as a coupling capacitor for blocking the DC signal, but be also used for the impedance matching with the inductor L1. Also, the amplification device 100 can further include an inductor LA. The inductor LA can be coupled in series with the capacitor CB of the amplification circuit 110 for impedance matching. Furthermore, in some embodiments, the inductor LA and the amplification circuit 110 can be disposed in the same chip. However, in some other embodiments, the inductor LA can be disposed on the system printed circuit board and can be coupled to the chip containing the amplification circuit 110 through external traces.

Figure 2:
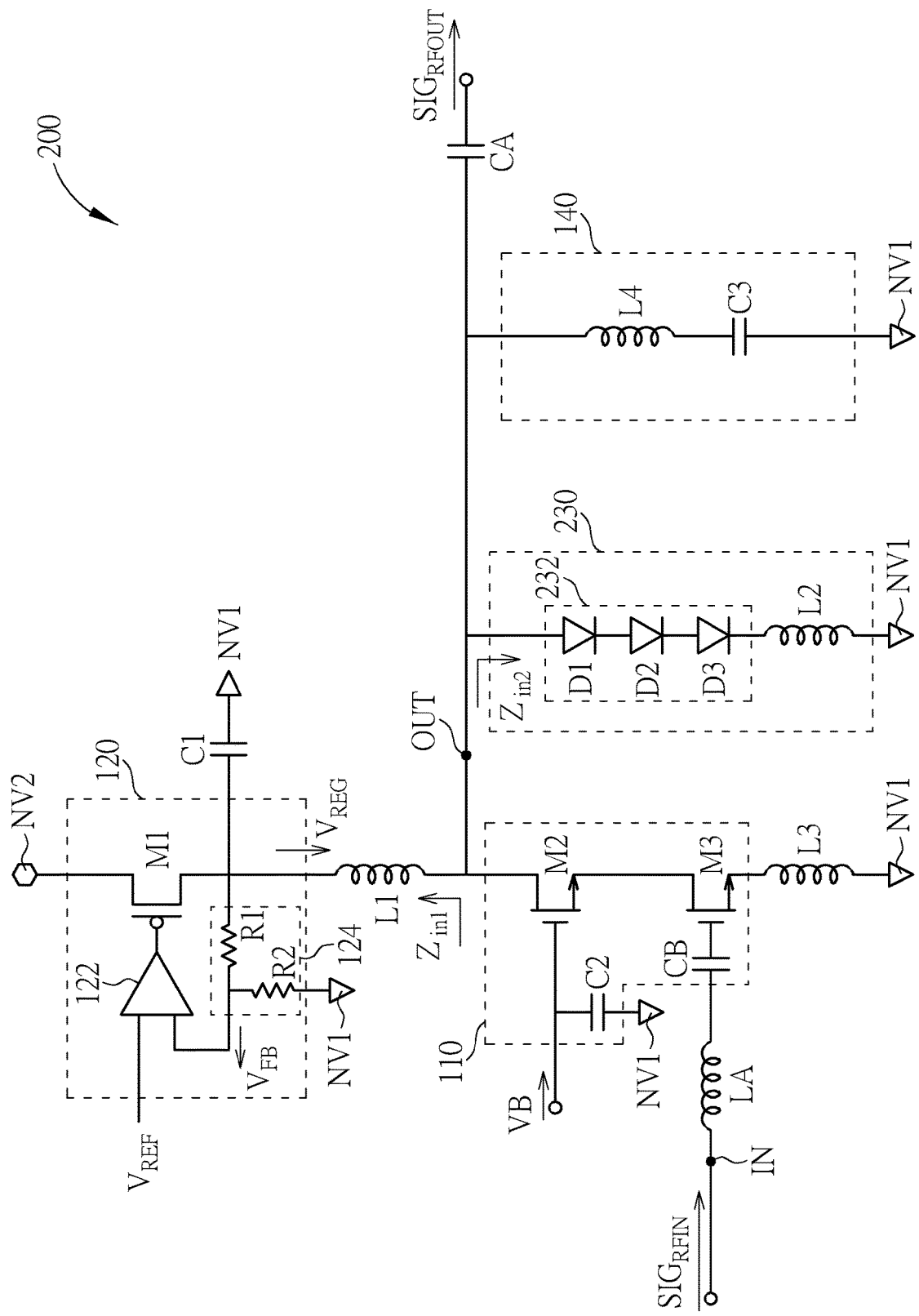
FIG. 2 shows an amplification device according to another embodiment of the present invention.

In FIG. 1, the low frequency impedance unit 132 can be implemented with diode connected transistors. However, in some other embodiments of the present invention, the low frequency impedance unit 132 can be implemented by diodes. Also, in the impedance circuit 130, the connecting order of the low frequency impedance unit 132 and the second inductor L2 can be reversed. FIG. 2 shows an amplification device 200 according to one embodiment of the present invention. The amplification device 200 and the amplification device 100 have similar structures and can be operated with similar principles. However, the impedance circuit 230 in FIG. 2 is slightly different from the impedance circuit 130 in FIG. 1.

In FIG. 2, the impedance circuit 230 can include a low frequency impedance unit 232 and a second inductor L2 coupled in series between the first terminal and the second terminal of the impedance circuit 230. The low frequency impedance unit 232 has a first terminal coupled to the first terminal of the impedance circuit 230, and a second terminal. The second inductor L2 has a first terminal coupled to the second terminal of the low frequency impedance unit 232, and a second terminal coupled to the second terminal of the impedance circuit 230. Furthermore, the low frequency impedance unit 232 can include at least one diode D1. In FIG. 2, the low frequency impedance unit 232 can include the diodes D1, D2, and D3. Also, the anode of the diode D1 can be coupled to the first terminal of the low frequency impedance unit 232, and the cathode of the diode D1 can be coupled to the anode of the diode D2. The cathode of the diode D2 can be coupled to the anode of the diode D3, and the cathode of the diode D3 can be coupled to the second terminal of the low frequency impedance unit 232. That is, the diodes D1 to D3 in the low frequency impedance unit 232 can be connected in series and forward biased.

Figure 3:
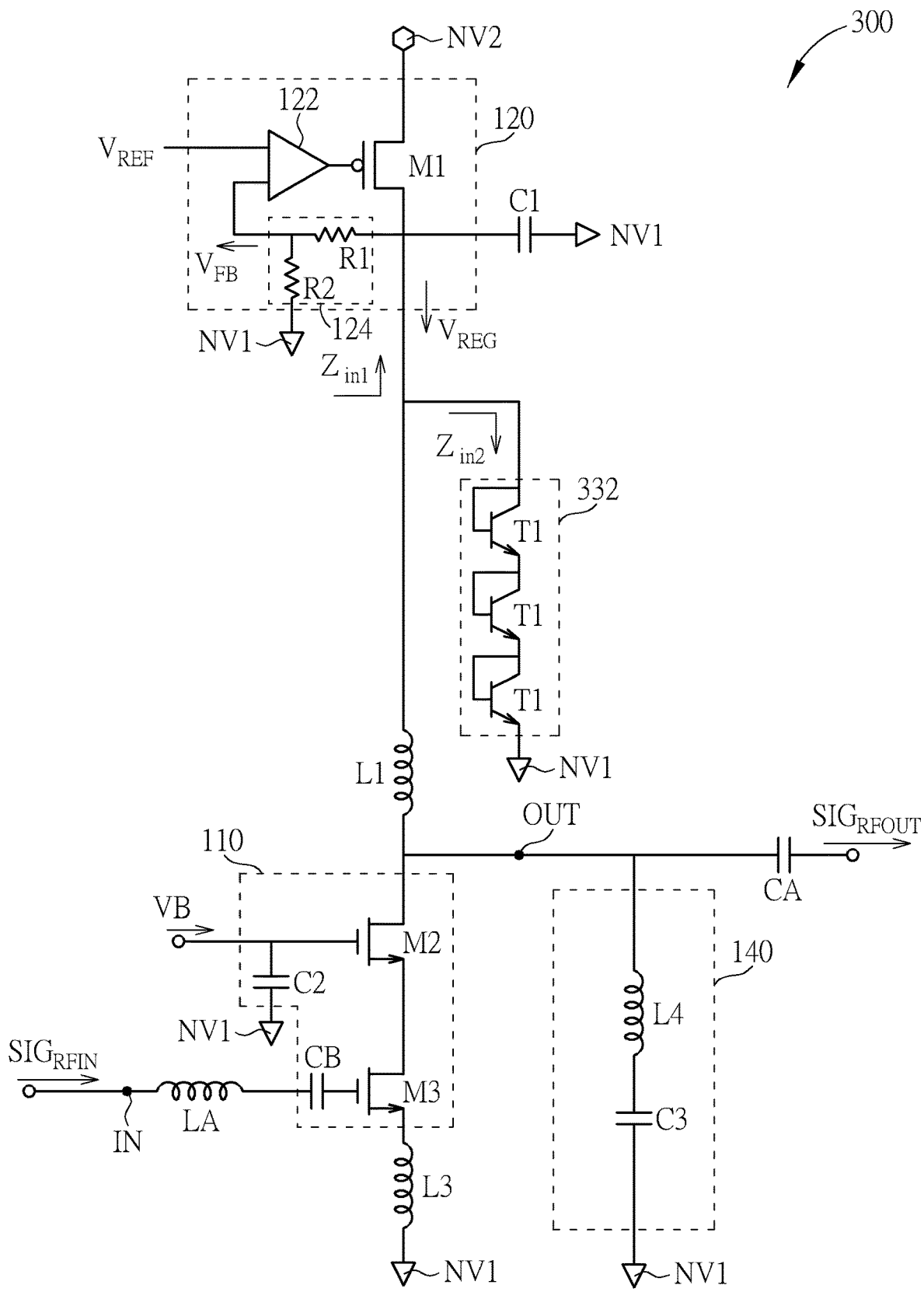
FIG. 3 shows an amplification device according to another embodiment of the present invention.

FIG. 3 shows an amplification device 300 according to one embodiment of the present invention. The amplification device 300 and the amplification device 100 have similar structures and can be operated with similar principles. However, in the amplification device 300, the first terminal of the low frequency impedance unit 332 can be coupled to the first terminal of the inductor L1, and the second terminal of the low frequency impedance unit 332 can be coupled to the first system voltage terminal NV1 to provide a low frequency impedance path for suppressing the beat frequency signal in the amplified RF signal $SIG_{RFOUT}$. In this case, the low frequency impedance unit 332 and the regulator 120 can be both used to suppress the high frequency signals through the first inductor L1, therefore, the second inductor L2 used in the impedance circuit 130 as shown in FIG. 1 can be omitted in FIG. 3.

Furthermore, in FIG. 3, the regulator 120 and the low frequency impedance unit 332 can be seen as being coupled in parallel for high frequency signals. In some embodiments, to suppress the beat frequency signal in the amplified RF signal $SIG_{RFOUT}$, the low frequency input impedance $Z_{in2}$ looking into the low frequency impedance unit 332 can be smaller than the low frequency input impedance $Z_{in1}$ looking into the regulator 120 for the amplified radio frequency signal $SIG_{RFOUT}$.

In summary, the embodiments of the present invention can provide a low frequency impedance path with the impedance circuit or a low frequency impedance unit to suppress the beat frequency signals, thereby reducing the distortion caused by IM3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification device comprising:
   an amplification circuit having an input terminal configured to receive a radio frequency signal, and an output terminal configured to output an amplified radio frequency signal;
   a first inductor having a first terminal, and a second terminal coupled to the output terminal of the amplification circuit;
   a regulator coupled to the first terminal of the first inductor and configured to generate a steady voltage and/or a steady current; and
   an impedance circuit having a first terminal coupled to the output terminal of the amplification circuit, and a second terminal coupled to a first system voltage terminal, and the impedance circuit being configured to provide a low frequency impedance path to suppress a beat frequency signal in the amplified radio frequency signal.

2. The amplification device of claim 1, wherein the impedance circuit comprises:
   a second inductor having a first terminal coupled to the first terminal of the impedance circuit, and a second terminal; and
   a low frequency impedance unit having a first terminal coupled to the second terminal of the second inductor, and a second terminal coupled to the second terminal of the impedance circuit.

3. The amplification device of claim 2, wherein an impedance of the low frequency impedance unit changes with a cross voltage of the low frequency impedance unit.

4. The amplification device of claim 2, wherein the low frequency impedance unit comprises:
   at least one diode or at least one diode-connected transistor;
   wherein number of the at least one diode or number of the at least one diode-connected transistor is determined according to the steady voltage outputted by the regulator.

5. The amplification device of claim 1, wherein the impedance circuit comprises:
   a low frequency impedance unit having a first terminal coupled to the first terminal of the impedance circuit, and a second terminal; and
   a second inductor having a first terminal coupled to the second terminal of the low frequency impedance unit, and a second terminal coupled to the second terminal of the impedance circuit.

6. The amplification device of claim 1, wherein:
   a low frequency input impedance looking into the impedance circuit is smaller than a low frequency input impedance looking into the first inductor for the amplified radio frequency signal.

7. The amplification device of claim 1, wherein the regulator comprises:

a first transistor having a first terminal coupled to a second system voltage terminal, a second terminal coupled to the first terminal of the first inductor, and a control terminal;

an amplifier having a first input terminal configured to receive a reference voltage, a second input terminal configured to receive a feedback voltage, and an output terminal coupled to the control terminal of the first transistor; and a feedback unit having a first terminal coupled to the second terminal of the first transistor, and a second terminal configured to output the feedback voltage to the second input terminal of the amplifier.

8. The amplification device of claim 7 further comprising:

a first capacitor having a first terminal coupled to the second terminal of the first transistor, and a second terminal coupled to the first system voltage terminal.

9. The amplification device of claim 1, wherein the amplification circuit comprises:

a second transistor having a first terminal coupled to the output terminal of the amplification circuit, a second terminal, and a control terminal;

a second capacitor having a first terminal coupled to the first system voltage terminal, and a second terminal coupled to the control terminal of the second transistor;

a third capacitor having a first terminal coupled to the input terminal of the amplification circuit, and a second terminal; and a third transistor having a first terminal coupled to the second terminal of the second transistor, a second terminal, and a control terminal coupled to the second terminal of the third capacitor.

10. The amplification device of claim 9 further comprising:

a second inductor having a first terminal coupled to the second terminal of the third transistor, and a second terminal coupled to the first system voltage terminal.

11. The amplification device of claim 1 further comprising:

a filter having a first terminal coupled to the output terminal of the amplification circuit, and a second terminal coupled to the first system voltage terminal, and the filter being configured to filter signals having a frequency two times the amplified radio frequency signal.

12. An amplification device comprising:

an amplification circuit having an input terminal configured to receive a radio frequency signal, and an output terminal configured to output an amplified radio frequency signal;

a first inductor having a first terminal, and a second terminal coupled to the output terminal of the amplification circuit;

a regulator coupled to the first terminal of the first inductor and configured to generate a steady voltage and/or a steady current; and a low frequency impedance unit having a first terminal coupled to the first terminal of the first inductor, and a second terminal coupled to a first system voltage terminal, and the low frequency impedance unit being configured to provide a low frequency impedance path to suppress a beat frequency signal in the amplified radio frequency signal.

13. The amplification device of claim 12, wherein the regulator comprises:

a first transistor having a first terminal coupled to a second system voltage terminal, a second terminal coupled to the first terminal of the first inductor, and a control terminal;

an amplifier having a first input terminal configured to receive a reference voltage, a second input terminal configured to receive a feedback voltage, and an output terminal coupled to the control terminal of the first transistor; and a feedback unit having a first terminal coupled to the second terminal of the first transistor, and a second terminal configured to output the feedback voltage to the second input terminal of the amplifier.

14. The amplification device of claim 13 further comprising:

a first capacitor having a first terminal coupled to the second terminal of the first transistor, and a second terminal coupled to the first system voltage terminal.

15. The amplification device of claim 12, wherein the amplification circuit comprises:

a second transistor having a first terminal coupled to the output terminal of the amplification circuit, a second terminal, and a control terminal;

a second capacitor having a first terminal coupled to the first system voltage terminal, and a second terminal coupled to the control terminal of the second transistor;

a third capacitor having a first terminal coupled to the input terminal of the amplification circuit, and a second terminal; and a third transistor having a first terminal coupled to the second terminal of the second transistor, a second terminal, and a control terminal coupled to the second terminal of the third capacitor.

16. The amplification device of claim 15 further comprising:

a second inductor having a first terminal coupled to the second terminal of the third transistor, and a second terminal coupled to the first system voltage terminal.

17. The amplification device of claim 12, wherein an impedance of the low frequency impedance unit changes with a cross voltage of the low frequency impedance unit.

18. The amplification device of claim 12, wherein the low frequency impedance unit comprises:

at least one diode or at least one diode-connected transistor;

wherein number of the at least one diode or number of the at least one diode-connected transistor is determined according to the steady voltage outputted by the regulator.

19. The amplification device of claim 12, wherein:

a low frequency input impedance looking into the low frequency impedance unit is smaller than a low frequency input impedance looking into the regulator for the amplified radio frequency signal.

20. The amplification device of claim 12 further comprising:

a filter having a first terminal coupled to the output terminal of the amplification circuit, and a second terminal coupled to the first system voltage terminal, and the filter being configured to filter signals having a frequency two times the amplified radio frequency signal.

* * * * *